United States Patent
Park (10) Patent No.: US 9,881,953 B2
(45) Date of Patent: Jan. 30, 2018

(54) PIXEL ARRAY, IMAGE SENSOR INCLUDING THE SAME, AND METHOD OF DRIVING THE SAME

(75) Inventor: Seong Hyung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 617 days.

(21) Appl. No.: 14/111,628

(22) PCT Filed: Apr. 29, 2011

(86) PCT No.: PCT/KR2011/003243
§ 371 (c)(1),
(2), (4) Date: Dec. 30, 2013

(87) PCT Pub. No.: WO2012/141372
PCT Pub. Date: Oct. 18, 2012

(65) Prior Publication Data
US 2014/0117206 A1 May 1, 2014

(30) Foreign Application Priority Data
Apr. 13, 2011 (KR) .................. 10-2011-0034460

(51) Int. Cl.
*H01L 27/146* (2006.01)
*H04N 5/355* (2011.01)

(52) U.S. Cl.
CPC .. *H01L 27/14612* (2013.01); *H01L 27/14609* (2013.01); *H04N 5/3559* (2013.01); *H04N 5/35572* (2013.01)

(58) Field of Classification Search
CPC ........... H01L 27/1461; H01L 27/14609; H01L 27/14612; H04N 5/3559; H04N 5/35572
(Continued)

(56) References Cited

U.S. PATENT DOCUMENTS

2004/0041930 A1    3/2004   Chao et al.
2005/0269482 A1*  12/2005   Hopper ............ H01L 27/14609
                                                     250/208.1
(Continued)

FOREIGN PATENT DOCUMENTS

JP       2008-305983 A    12/2008
KR   10-2006-0088697 A     8/2006
(Continued)

OTHER PUBLICATIONS

Office Action dated May 23, 2014 in Taiwanese Application No. 100115207.
(Continued)

*Primary Examiner* — Georgia Y Epps
*Assistant Examiner* — Don Williams
(74) *Attorney, Agent, or Firm* — Saliwanchik, Lloyd & Eisenschenk (57) ABSTRACT

Disclosed are a pixel array, an image sensor including the same, and a method of driving the same. In a WDR (Wide Dynamic Range) pixel employing a storage region (FD node) including a varactor, a reset voltage, which is less than a voltage applied to a reset transistor according to the related art, that is, a partial reset voltage is applied to the reset transistor to read out a reset signal level for a CDS (Correlated Double Sampling) operation, thereby adjusting the operating voltage range of the storage region. The operating voltage range of the storage region is shifted into a range suitable for remarkably varying the capacitance of the varactor, thereby expanding the dynamic range.

7 Claims, 5 Drawing Sheets

(58) Field of Classification Search
USPC ........ 250/214 R, 214 C, 208.1; 348/294–312
See application file for complete search history.

(56) References Cited

U.S. PATENT DOCUMENTS

| | | | |
|---|---|---|---|
| 2006/0102827 A1* | 5/2006 | Kasuga | H01L 27/14609 250/208.1 |
| 2006/0180895 A1* | 8/2006 | Chen | H01L 23/5223 257/595 |
| 2007/0159190 A1 | 7/2007 | Lee et al. | |
| 2008/0164404 A1* | 7/2008 | Mansoorian | H04N 5/3559 250/208.1 |
| 2009/0002508 A1 | 1/2009 | Johnson | |
| 2011/0121162 A1* | 5/2011 | Murata | H01L 27/14603 250/208.1 |
| 2013/0062509 A1 | 3/2013 | Chuang | |

FOREIGN PATENT DOCUMENTS

| | | |
|---|---|---|
| KR | 10-2007-0034485 A | 3/2007 |
| KR | 10-2007-0035906 A | 4/2007 |
| TW | 200922298 A | 5/2009 |
| TW | 201105125 A | 2/2011 |

OTHER PUBLICATIONS

International Search Report in International Application No. PCT/KR2011/003243, filed Apr. 29, 2011.

* cited by examiner

(a) sensitivity variation in case 1

(b) sensitivity variation in case 2

[Fig. 5]

(a) potential diagram for case 1

(b) potential diagram for case 2

PIXEL ARRAY, IMAGE SENSOR INCLUDING THE SAME, AND METHOD OF DRIVING THE SAME

CROSS-REFERENCE TO RELATED APPLICATIONS

This application is the U.S. national stage application of International Patent Application No. PCT/KR2011/003243, filed Apr. 29, 2011, which claims priority to Korean Application No. 10-2011-0034460, filed Apr. 13, 2011, the disclosures of each of which are incorporated herein by reference in their entirety.

TECHNICAL FIELD

The embodiment relates to a pixel array, an image sensor including the same, and a method of driving the same. More particularly, according to the embodiment, in a WDR (Wide Dynamic Range) pixel employing a storage region (FD node) including a varactor, a reset voltage, which is less than a voltage applied to a reset transistor according to the related art, that is, a partial reset voltage is applied to the reset transistor to read out a reset signal level for a CDS (Correlated Double Sampling) operation, thereby adjusting the operating voltage range of the storage region. The operating voltage range of the storage region is shifted into a range suitable for remarkably varying the capacitance of the varactor, thereby expanding the dynamic range.

BACKGROUND ART

An image sensor according to the related art has a pixel structure including a photodiode and a transistor. In the pixel having the above structure, an incident light excites electrons of the photodiode so that a current flows. The quantity of the current varies according to the intensity of the light. Accordingly, after a predetermined time has elapsed, a shutter switch is turned on, and signals are transferred to a sense node so that image signals can be obtained.

However, the signal level is determined according to the capacity of a condenser of the sense node. Since the capacity of the condenser of the sense node is fixed in the related art, the operating range of an imaging device is narrowed. In addition, since the imaging device cannot perform an automatic exposure function, the imaging device performs the exposure function by adjusting the exposure time of a sensor or adding the gain of an image signal through an image signal processing block.

In order to solve the above problems, there has been suggested a technology in which a varactor employing a MOS capacitor is used so that the capacity of a condenser of the varactor can be adjusted to expand the operating range of the imaging device.

However, since a voltage level range of the storage region including the varactor in an image sensor employing the varactor differs from the range in which the capacitance of the varactor actually varies, the dynamic range cannot be actually expanded.

DISCLOSURE OF INVENTION

Technical Problem

The embodiment provides a method of expanding a dynamic range of a pixel array in an image sensor employing a varactor by shifting the voltage level of the storage region including the varactor into a range in which the capacitance of the varactor actually varies.

Solution to Problem

According to the embodiment, there is provided a pixel array including a photo-electro conversion unit on a substrate, a transfer switching unit on the substrate at one side of the photo-electro conversion unit, a storage region on the substrate at one side of the transfer switching unit, a varactor capacitor on the storage region, and a reset switching unit on the substrate at one side of the storage region. The reset switching unit is partially turned on to regulate an operating voltage range of the storage region before reset and signal levels of the storage region are read out.

According to the embodiment, there is provided an imaging apparatus including a pixel array including a plurality of pixels. Each pixel includes a photo-electro conversion unit on a substrate, a transfer switching unit on the substrate at one side of the photo-electro conversion unit, a storage region on the substrate at one side of the transfer switching unit, a varactor capacitor on the storage region, and a reset switching unit on the substrate of one side of the storage region. The reset switching unit is partially open to regulate an operating voltage range of the storage region before reset and signal levels of the storage region are read out.

According to the embodiment, there is provided a method of driving a pixel array including starting an integration procedure for a photo-electro conversion unit, regulating an operating voltage range of a storage region including a varactor by applying a partial reset signal to a reset switching unit, reading-out a reset level, transferring stored optical charges from the photo-electro conversion unit to the storage region by turning on a transfer switching unit, and reading-out the optical charges that have been transferred to the storage region.

Advantageous Effects of Invention

As described above, the embodiment can expand the dynamic range of the pixel array by adjusting only the level of the reset voltage applied to a reset transistor.

MODE FOR THE INVENTION

Hereinafter, embodiments will be described with reference to accompanying drawings.

Figure 1:
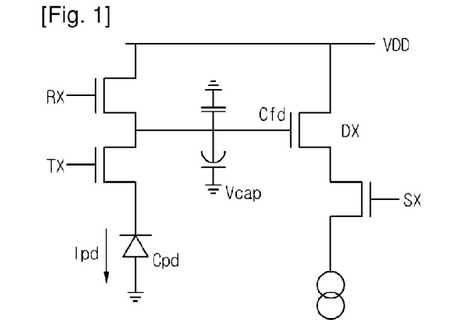
FIG. 1 is a circuit diagram showing a pixel array according to one embodiment.
Figure 2:
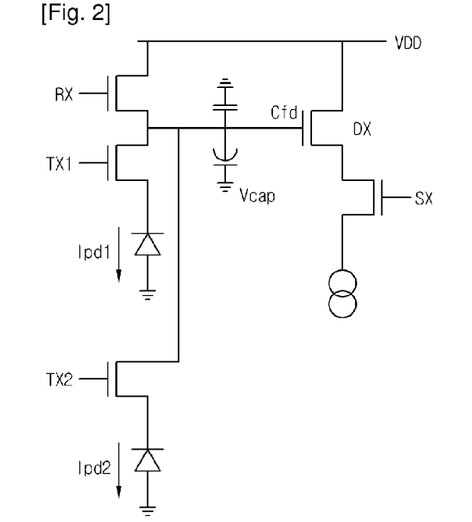
FIG. 2 is a circuit diagram showing a pixel array according to another embodiment.

FIG. 1 is a circuit diagram showing a pixel array according to one embodiment, and FIG. 2 is a circuit diagram showing a pixel array according to another embodiment.

The pixel array according to the embodiment and an image sensor including the pixel array include a photo-electro conversion unit formed on a substrate, a transfer switching unit provided on the substrate of one side of the photo-electro conversion unit, a storage region provided on the substrate of one side of the transfer switching unit, a varactor capacitor formed on the storage region, and a reset switching unit provided on the substrate of one side of the storage region. The reset switching unit is partially open to adjust the operating voltage range of the storage region before reading-out reset and signal levels of the storage region.

The photo-electro conversion unit may include a PD (photodiode) or a photogate, but the embodiment is not limited thereto.

FIG. 1 shows a 4Tr CMOS imaging device, but the embodiment is not limited thereto. For example, the transistor may include a transfer transistor TX provided at one side of the photo-electro conversion unit, a reset transistor RX provided at one side of the transfer transistor TX, a drive transistor DX, and a select transistor SX, but the embodiment is not limited thereto.

As shown in FIG. 1, one node of a varactor capacitor Vcap is connected to the storage region, for example, an FD (Floating Diffusion) region or a gate of the SF (source follower) transistor DX, and another node of the varactor capacitor is connected to a P-sub substrate, thereby realizing the varactor capacitor Vcap in the pixel.

In addition, FIG. 2 shows an example of the shared structure of the storage region including first and second transfer transistors TX1 and TX2. In the shared structure, the first and second transfer transistors TX1 and TX2 share the FD region with each other, and the FD node and the P-Sub constitute both terminals of the varactor capacitor Vcap, thereby constructing a varactor capacitor normally operating. The construction method can be applied to various shared structures such as 4-shared, 6-shared, and 8-shared structures.

For example, according to the embodiment, an additional capacity is automatically made in the FD by using the varactor capacitor without performing external biasing-control against the change of the potential of the FD, so the sensitivity can be constantly maintained under the low intensity of illumination, and the capacity of the FD can be increased under the high intensity of illumination. Thus, an ideal Lin-Log sensitivity characteristic of a WDR can be represented.

Figure 3:
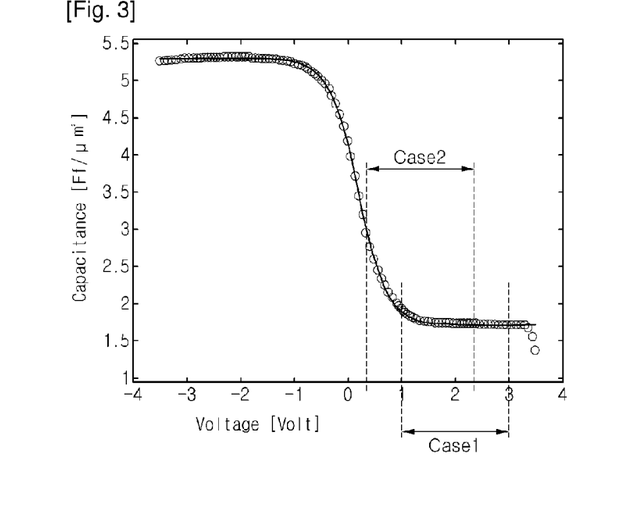
FIG. 3 is a graph showing the variation of capacitance according to voltages of a typical PMOS varactor.

FIG. 3 is a graph showing the variation of capacitance according to applied voltages of a typical PMOS varactor. As shown in FIG. 3, actually, the capacitance has great variation in the range of +1V to +1V.

As shown in FIG. 3, case 1 represents a pixel having a reset level of 3V on the assumption that the voltage swing width of an FD node including a typical varactor, that is, the voltage variation of the FD node is 1V. Actually, the FD node operates in the range of about 1V to 3V. Accordingly, even if a voltage is applied to the FD node, the capacitance value does not vary.

As shown in FIG. 3, case 2 represents that the operating voltage range of the FD node is changed according to the embodiment. In this case, the voltage range in which the capacitance value of the varactor is changed according to voltage application is in the range of about 0.5V to about 2.5V, and the variation of the capacitance value according to the voltage application is increased in the this range. In this voltage range of about 0.5V to about 2.5V, the capacitance value of the varactor is increased by about 40%.

In other words, if the reset level of the FD node including the varactor is changed, the capacitance capacity of the FD node is increased. Accordingly, the dynamic range can be expanded as described below.

Figure 4:
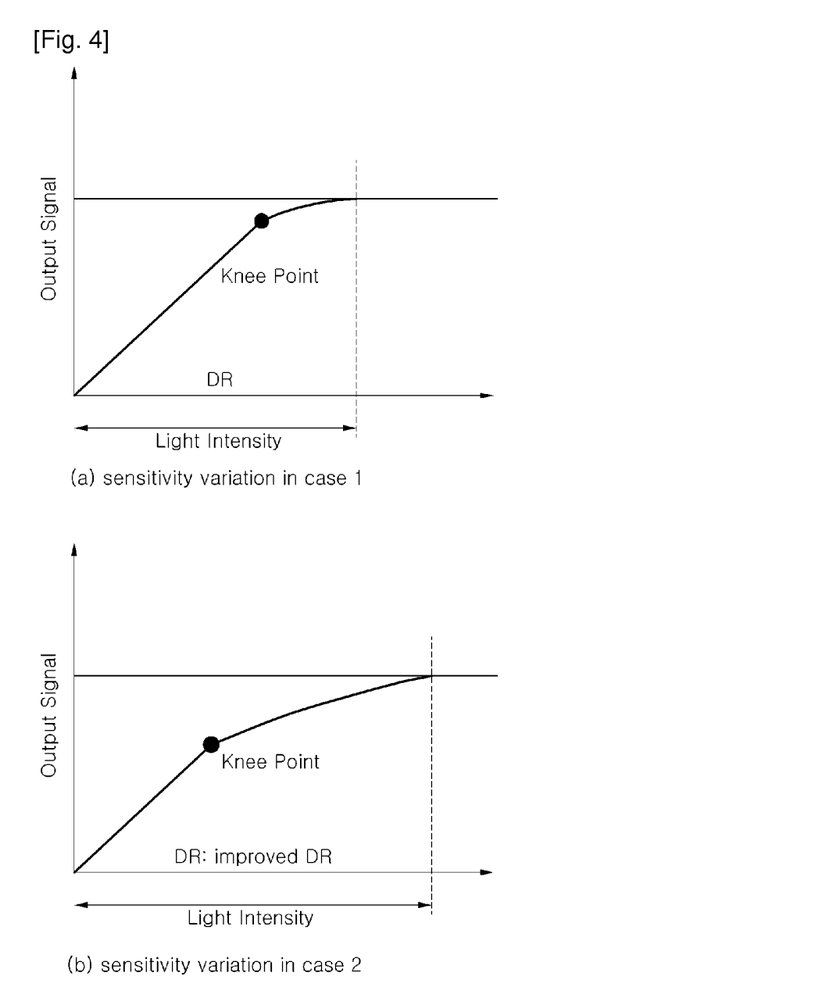
FIGS. 4(a) and 4(b) are graphs showing output signals according to light intensities in case 1 and case 2.

FIG. 4(a) and FIG. 4(b) are graphs showing output signals according to light intensities in case 1 and case 2. FIG. 4(a) shows a knee point of a Lin-Log. The knee point can be used to optimize an image by intentionally adjusting the knee point in the whole dynamic range of an actual image. In other words, as shown in FIGS. 4(a) and 4(b), according to the embodiment, the operating voltage range of the storage region, that is, the FD node is adjusted, so that the dynamic range can be widened.

In the technology of the wide dynamic range, the detection range of the light intensities within a readable and preset output signal range of the storage region is important.

A sensor of FIG. 4(b) has a wider dynamic range than a sensor of FIG. 4(a). Therefore, the position of the knee point to make a log curve is important.

In this case, if the knee point is adjusted by changing the lay-out or the process condition of a varactor, the adjustment of the knee point is very difficult, and a great amount of cost is required to adjust the knee point. However, according to the embodiment, a partial voltage is applied to the gate of the reset transistor RX to adjust the operating voltage of the FD node, thereby expanding the dynamic range.

Figure 5:
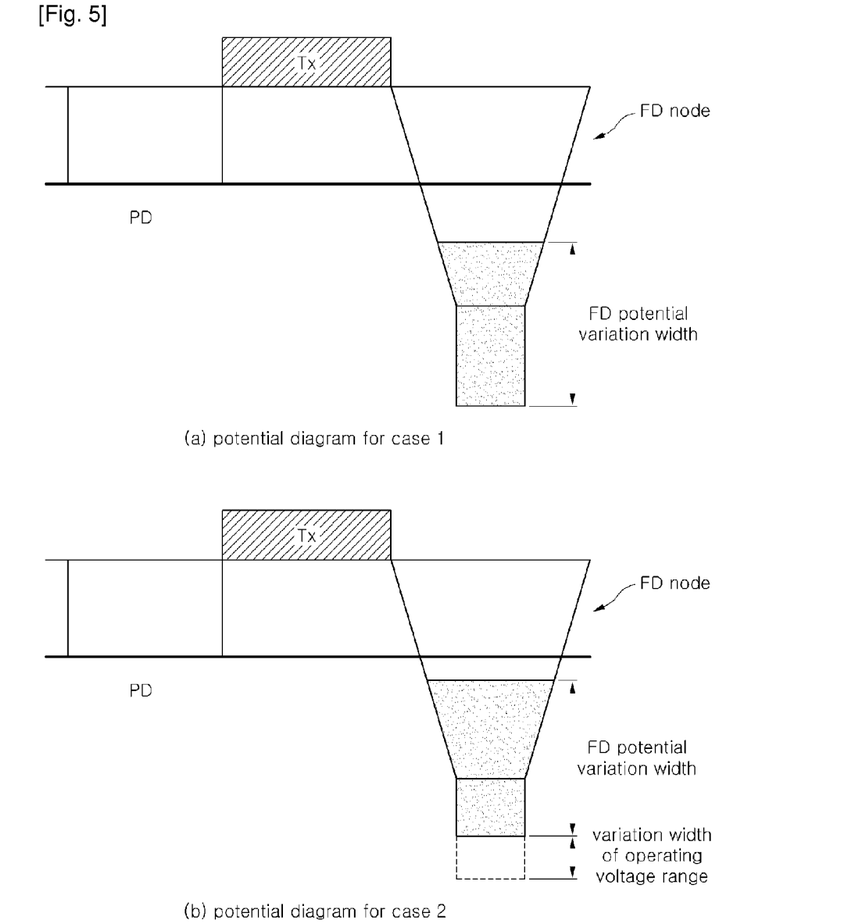
FIGS. 5(a) and 5(b) are potential diagrams to explain the adjustment of the operating voltage range of an FD node including the varactor according to the embodiment.

FIGS. 5(a) and 5(b) are potential diagrams to explain the adjustment of the operating voltage range of the FD node including the varactor according to the embodiment. As shown in FIGS. 5(a) and 5(b), the potential of the FD node including the varactor are shown in the form of a bucket having a funnel shape having a wide upper portion and a narrow lower portion. The width of the bucket may correspond to the capacitance of the varactor varying according to the applied voltages.

As shown in FIGS. 5(a) and 5(b), the FD node has a uniform potential variation width. However, if the operating voltage range is changed, the potential that may be stored in the FD node is substantially increased as shown in FIG. 5(b).

Figure 6:
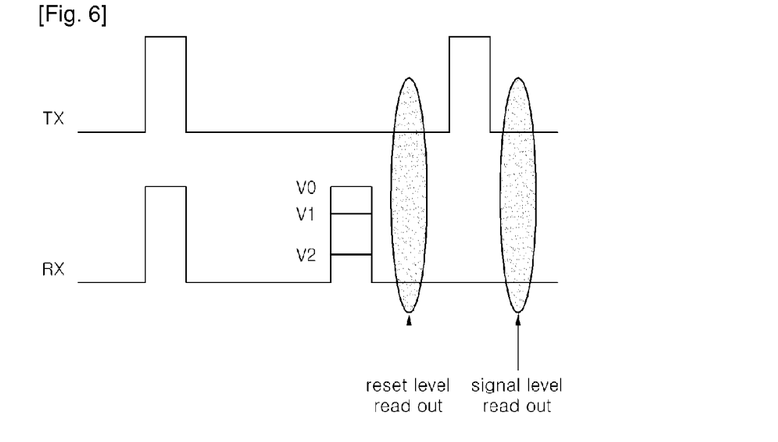
FIG. 6 shows timing diagrams of signals applied to a transfer transistor and a reset transistor according to the embodiment.

FIG. 6 shows timing diagrams of signals applied to the transfer transistor TX and the reset transistor RX according to the embodiment.

As shown in FIG. 6, after reading out the reset level of the FD node, a signal level is read out. According to one embodiment, a partial reset voltage is applied to the FD node right before the reset level is read out, so that the operating voltage range of the FD node can be adjusted.

Figure 7:
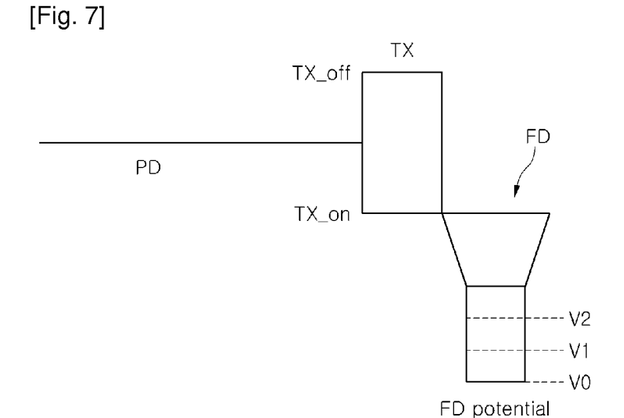
FIG. 7 is a view showing the variation of the operating voltage range of the FD according to applied partial reset voltages according to the embodiment.

On the assumption that a peak level of a reset voltage is about 3V for example, if the reset voltage of 3V is applied to the FD node, the FD node operates identically to that of a conventional technology. If a reset voltage less than 3V, that is, a voltage of V1 or V2 of FIG. 6 is applied to the FD node, the operating voltage range of the FD node is changed as shown in FIG. 7, and the potential of FD node is changed.

As electric charges are charged in the FD node according to the operating voltage range of the FD node, the variation in the capacitance of the varactor constituting the FD node is increased. Therefore, the dynamic range of the image sensor is expanded.

Figure 8:
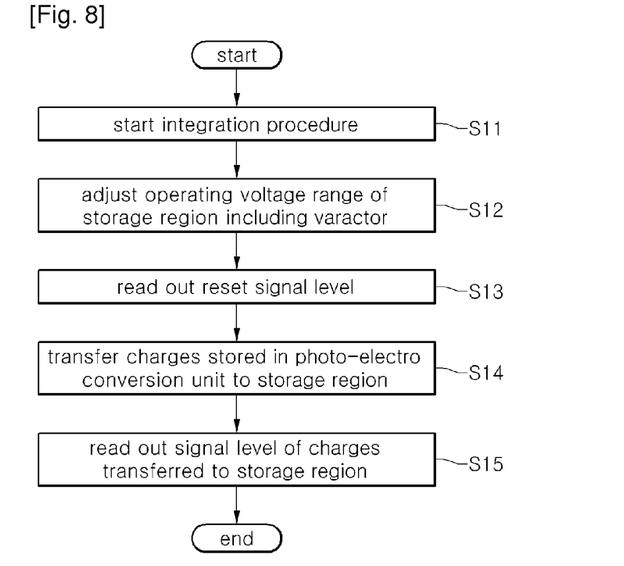
FIG. 8 is a flowchart showing a method of driving a pixel according to one embodiment.

FIG. 8 is a flowchart showing a method of driving a pixel according to one embodiment.

In step S11, the reset transistor RX and the transfer transistor TX are turned on so that charges stored in the PD and the storage region, that is, the FD are drained.

In step S12, a partial voltage is applied to the reset transistor RX, so that the operating voltage range of the storage region can be adjusted.

In step S13, a reset signal level is read out.

In step S14, the transfer transistor TX is turned on, so that charges stored in the photo-electro conversion unit, that is, the PD are transferred to the storage region.

In step S15, the signal level of the charges transferred to the storage region is read out.

Figure 9:
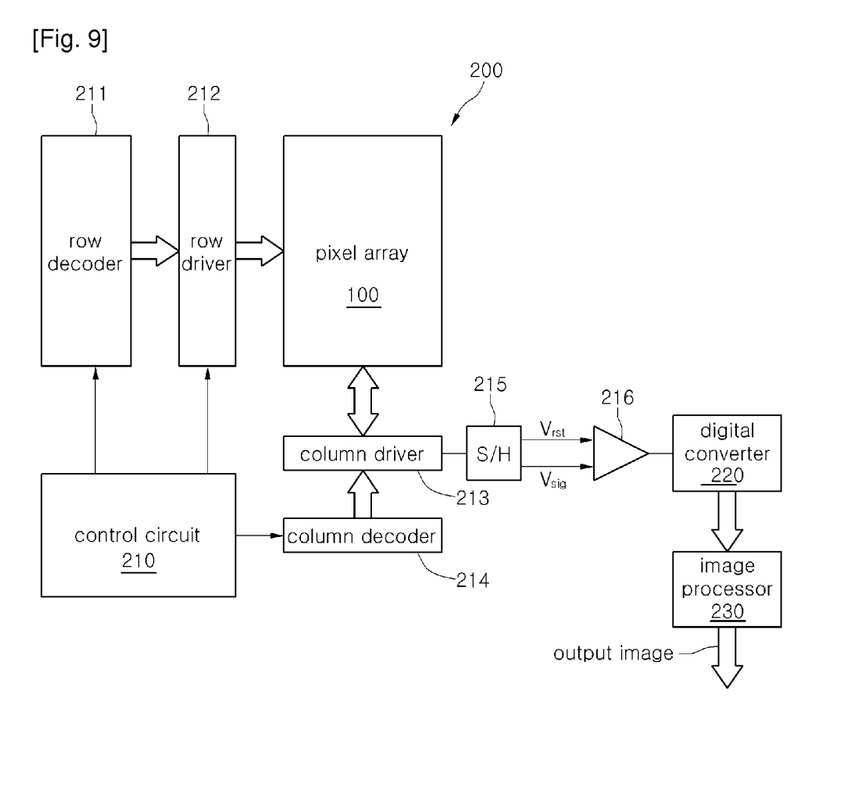
FIG. 9 is a block diagram showing an imaging device according to the embodiment.

The method for operating a pixel cell according to the embodiment may be employed in a pixel array 100 of an imaging apparatus 200 as shown in FIG. 9. The pixel array 100 includes a plurality of pixel cells, which are configured and operated according to at least one of the embodiments described above. The pixel cells are arranged in the form of a matrix including columns and rows. A signal processing circuit is connected to the pixel array 100 and a part of the signal processing circuit is formed on a substrate. The pixel cells in rows of the pixel array 100 are turned on at the same time by the row selection line and selectively output by each column selection line. A plurality of row lines and column lines are provided in the pixel array 100. The row lines are selectively activated by the row driver 212 according to a row address decoder 211. Thus, the row and column addresses are provided for each pixel.

The CMOS imaging apparatus 200 is operated by a control circuit 210, which controls address decoders 211 and 214 in order to select proper row and column lines to apply the control voltage to the transfer and reset transistors to read out the pixel. The control circuit 210 controls row and column driver circuits 245 and 260 such that a driving voltage is applied to a driving transistor of the selected row and column lines. A pixel cell column signal typically including a pixel reset signal Vrst and a pixel image signal Vsig is read out by a sample and hold circuit 215. Differential signals (Vrst−Vsig) are generated with respect to pixels by a differential amplifier 216. The differential signals are digitized by an analog-digital converter (ADC) 220. The ADC 220 supplies a digitized pixel signal to an image processor 230 to form and output a digitized image.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A pixel array comprising:
   a photo-electro conversion unit on a substrate;
   a transfer switching unit on the substrate at a first side of the photo-electro conversion unit;
   a storage region on the substrate at a first side of the transfer switching unit;
   a varactor capacitor on the storage region; and
   a reset switching unit on the substrate at first side of the storage region;
   a source follower directly connected to a second side of the storage region; and
   a select switching unit connected to the second side of the storage region;
   wherein the reset switching unit applies a partial reset voltage to regulate an operating voltage range of the storage region before reset and signal levels of the storage region are read out,
   wherein one node of the varactor capacitor is directly connected to the storage region and is connected to a gate of the source follower,
   wherein the storage region is a shared structure of the storage region,
   wherein the shared structure of the storage region comprises first and second transfer transistors,
   wherein an opposite node of the varactor capacitor is directly connected to the substrate,
   wherein the opposite node of the varactor capacitor that is directly connected to the substrate is directly connected to a P-sub substrate,
   wherein a first side of the source follower is connected to a first side of the reset switching unit,
   wherein a second side of the source follower is directly connected to a first side of the select switching unit,
   wherein the varactor capacitor is self-biased and variable, and
   wherein, as electric charges are charged in the storage region according to an operating voltage range of the storage region, a variation in the capacitance of the varactor capacitor is increased.

2. The pixel array of claim 1, wherein the varactor capacitor includes a P type varactor capacitor.

3. The pixel array of claim 1, wherein the shared structure shares a Floating Diffusion region with each other.

4. The pixel array of claim 1, wherein the partial reset voltage is 1V or 2V.

5. An imaging apparatus comprising a pixel array including a plurality of pixels, wherein each pixel comprises:
   a photo-electro conversion unit on a substrate;
   a transfer switching unit on the substrate at a first side of the photo-electro conversion unit;
   a storage region on the substrate of a first side at the transfer switching unit;
   a varactor capacitor on the storage region; and
   a reset switching unit on the substrate at a first side of the storage region;
   a source follower directly connected to a second side of the storage region; and
   a select switching unit connected to the second side of the storage region;
   wherein the reset switching unit applies a partial reset voltage to regulate an operating voltage range of the storage region before reset and signal levels of the storage region are read out, wherein one node of the varactor capacitor is directly connected to the storage region and is connected to a gate of the source follower, wherein the storage region is a shared structure of the storage region, wherein the shared structure of the storage region comprises first and second transfer transistors, wherein an opposite node of the varactor capacitor is directly connected to the substrate, wherein the opposite node of the varactor capacitor that is directly connected to the substrate is directly connected to a P-sub substrate, wherein a first side of the source follower is connected to a first side of the reset switching unit, wherein a second side of the source follower is directly connected to a first side of the select switching unit, wherein the varactor capacitor is self-biased and variable, and wherein, as electric charges are charged in the storage region according to an operating voltage range of the storage region, a variation in the capacitance of the varactor capacitor is increased.

6. The imaging apparatus of claim 5, wherein the varactor capacitor includes a P type varactor capacitor.

7. The imaging apparatus of claim 5, wherein the shared structure shares a Floating Diffusion region with each other.

* * * * *